(12) United States Patent
Platzer et al.

(10) Patent No.: US 10,872,187 B2
(45) Date of Patent: Dec. 22, 2020

(54) VERIFIED RUNTIME VALIDATION OF VERIFIED CYBER-PHYSICAL SYSTEM MODELS

(71) Applicant: Carnegie Mellon University, Pittsburgh, PA (US)

(72) Inventors: André Platzer, Pittsburgh, PA (US); Stefan Mitsch, Pittsburgh, PA (US)

(73) Assignee: CARNEGIE MELLON UNIVERSITY, Pittsburgh, PA (US)

( * ) Notice: Subject to any disclaimer, the term of this patent is extended or adjusted under 35 U.S.C. 154(b) by 1053 days.

(21) Appl. No.: 15/026,690

(22) PCT Filed: Oct. 10, 2014

(86) PCT No.: PCT/US2014/060019
§ 371 (c)(1),
(2) Date: Apr. 1, 2016

(87) PCT Pub. No.: WO2015/102717
PCT Pub. Date: Jul. 9, 2015

(65) Prior Publication Data
US 2016/0253437 A1    Sep. 1, 2016

Related U.S. Application Data

(60) Provisional application No. 61/961,366, filed on Oct. 11, 2013, provisional application No. 61/999,318, filed on Jul. 23, 2014.

(51) Int. Cl.
*G06F 30/3323*   (2020.01)

(52) U.S. Cl.
CPC .............................. *G06F 30/3323* (2020.01)

(58) Field of Classification Search
CPC ...................................................... G06F 17/504
USPC .......................................................... 703/13
See application file for complete search history.

(56) References Cited

U.S. PATENT DOCUMENTS

| 6,289,502 B1 | 9/2001 | Garland et al. |
| 2011/0295578 A1* | 12/2011 | Aldrich ............ G06F 8/10 703/6 |
| 2012/0017119 A1 | 1/2012 | Ghosh et al. |

OTHER PUBLICATIONS

Tan, et al., Testing and Monitoring Model-Based Generated Program, U. Penn Scholarly Commons, Jul. 13, 2003.*

(Continued)

*Primary Examiner* — Saif A Alhija

(57) ABSTRACT

A method for ensuring that verification results about models apply to cyber-physical systems (CPS) implementations is presented. The invention provides correctness guarantees for CPS executions at runtime. Offline verification of CPS models are combined with runtime validation of system executions for compliance with the model. The invention ensures that the verification results obtained for the model apply to the actual system runs by monitoring the behavior of the world for compliance with the model, assuming the system dynamics deviation is bounded. If, at some point, the observed behavior no longer complies with the model, such that offline verification results no longer apply, provably safe fallback actions are initiated. The invention includes a systematic technique to synthesize provably correct monitors automatically from CPS proofs in differential dynamic logic.

20 Claims, 4 Drawing Sheets

(56) References Cited

OTHER PUBLICATIONS

Zouaghi, et al., Monitoring of Hybrid Systems Using Behavioral System Specification, IFAC World Congress, Aug. 28-Sep. 2, 2011.*
Bartocci, et al., Adaptive Runtime Verification, 2012 Runtime Verification Conf., Sep. 25-28, 2012.

* cited by examiner

VERIFIED RUNTIME VALIDATION OF VERIFIED CYBER-PHYSICAL SYSTEM MODELS

RELATED APPLICATIONS

This application claims the benefit, under 35 U.S.C. 0 371, of PCT Application No. PCT/US14/60019, filed Oct. 10, 2014, which claims the benefit of U.S. Provisional Application No. 61/961,366, filed on Oct. 11, 2013, and U.S. Provisional Application No. 61/999,318, Filed Jul. 23, 2014. All of these applications are hereby incorporated by reference.

GOVERNMENT INTEREST

This invention was made with government support under DARPA Number FA87501220291. The government has certain rights in this invention.

FIELD OF THE INVENTION

This invention pertains to the field of cyber-physical systems (CPS), and, in particular to models approximating the behavior of CPS and methods for monitoring the actual CPS that are based on the models.

BACKGROUND OF THE INVENTION

Formal verification and validation play a crucial role in making cyber-physical systems (CPS) safe. Formal methods make strong guarantees about the system behavior if accurate models of the system can be obtained, including models of the controller and of the physical dynamics. In CPS, models are essential; but any model that can be built necessarily deviates from the real world. If the real system fits to the model, the behavior of the real system can be guaranteed to satisfy the correctness properties verified with respect to the model. If not, then this verification is impossible.

Cyber-physical systems ("CPS") span controllers and the relevant dynamics of the environment. Since safety is crucial for CPS, their models (e. g., hybrid system models) need to be verified formally. Formal verification guarantees that a model is safe with respect to a safety property. The remaining task is to validate whether the models are adequate, such that the verification results transfer to the system implementation.

Actual system execution, however, provides many opportunities for surprising deviations from the model. Faults may cause the system to function improperly, sensors may deliver uncertain values and actuators may suffer from disturbance. The formal verification may have assumed simpler ideal-world dynamics for tractability reasons or made un-realistically strong assumptions about the behavior of other agents in the environment. Simpler models are often better for real-time decisions and optimizations, because they make predictions feasible to compute at the required rate. The same phenomenon of simplicity for predictability is often exploited for the models in formal verification and validation. As a consequence, the verification results obtained about models of a CPS only apply to the actual CPS at runtime to the extent that the system fits to the model.

Validation, i.e., checking whether a CPS implementation fits to a model, is an interesting but difficult problem. CPS models are more difficult to analyze than ordinary (discrete) programs because of the physical plant, the environment, sensor inaccuracies, and actuator disturbance. In CPS, models are essential; but any model necessarily deviates from the real world. Still, good models can be correct within certain error margins.

SUMMARY OF THE INVENTION

Herein we introduce a method (referred to herein as "ModelPlex") to synthesize monitors by theorem proving. The method uses sound proof rules to formally verify that a model is safe and to synthesize provably correct monitors that validate compliance of system executions with the model.

This invention performs runtime model validation. That is, validating whether a model, shown for example, in FIG. 3 as reference number 100, which is assumed for verification purposes is adequate for a particular system execution to ensure that the verification results apply to the current execution. The invention checks system execution with respect to a monitor specification 104, and thus, belongs to the field of runtime verification. Herein, the term runtime validation is used to clearly convey the purpose of monitoring. While "runtime verification" monitors properties without offline verification, "runtime validation" monitors model adequacy to transfer offline verification results. The focus of the invention is on verifiably correct runtime validation to ensure that verified properties of models provably apply, which is important for safety and certification of CPS.

If an observed system execution fits to the verified model 12, then this execution is safe according to the offline verification result about the model. If it does not fit, then the system is potentially unsafe because it no longer has an applicable safety proof, so a verified fail-safe action to avoid safety risks is initiated. Checking whether a system execution fits to a verified model 12 includes checking that the actions chosen by the (unverified) controller implementation fit to one of the choices and requirements of the verified controller model. It also includes checking that the observed states can be explained by the plant model. The crucial questions are: How can a compliance monitor be synthesized that provably represents the verified model? How much safety margin does a system need to ensure that fail-safe actions are initiated early enough for the system to remain safe even if its behavior ceases to comply with the model?

The second question is related to feedback control and can only be answered when assuming constraints on the deviation of the real system dynamics from the plant model. Otherwise, if the real system can be infinitely far off from the model, safety guarantees are impossible. By the sampling theorem in signal processing, such constraints further enable compliance monitoring solely on the basis of sample points instead of the unobservable intermediate states about which no sensor data exists. When such constraints are not available, the method of the present invention still generates verifiably correct runtime tests, which detect deviation from the model at the sampling points, not just between them. A fail-safe action will then lead to best-effort mitigation of safety risks (rather than guaranteed safety).

As presented herein, the present invention is a method to synthesize verifiably correct runtime validation monitors automatically. ModelPlex uses theorem proving with sound proof rules to turn hybrid system models into monitors in a verifiably correct way. Upon non-compliance with the model, ModelPlex initiates provably safe fail-safe actions.

ModelPlex is a principle to build and verify high-assurance controllers for safety-critical computerized systems that interact physically with their environment. It guarantees that verification results about CPS models transfer to the real system by safeguarding against deviations from the verified model. Monitors created by ModelPlex are provably correct and check at runtime whether or not the actual behavior of a CPS complies with the verified model and its assumptions. Upon non-compliance, ModelPlex initiates fail-safe fallback strategies. To initiate the fallback strategies early enough, ModelPlex uses prediction on the basis of disturbed plant models to check safety for the next control cycle. This way, ModelPlex ensures that verification results about a model of a CPS transfer to the actual system behavior at runtime.

DETAILED DESCRIPTION OF THE INVENTION

Preliminaries: Differential Dynamic Logic

Figure 1:
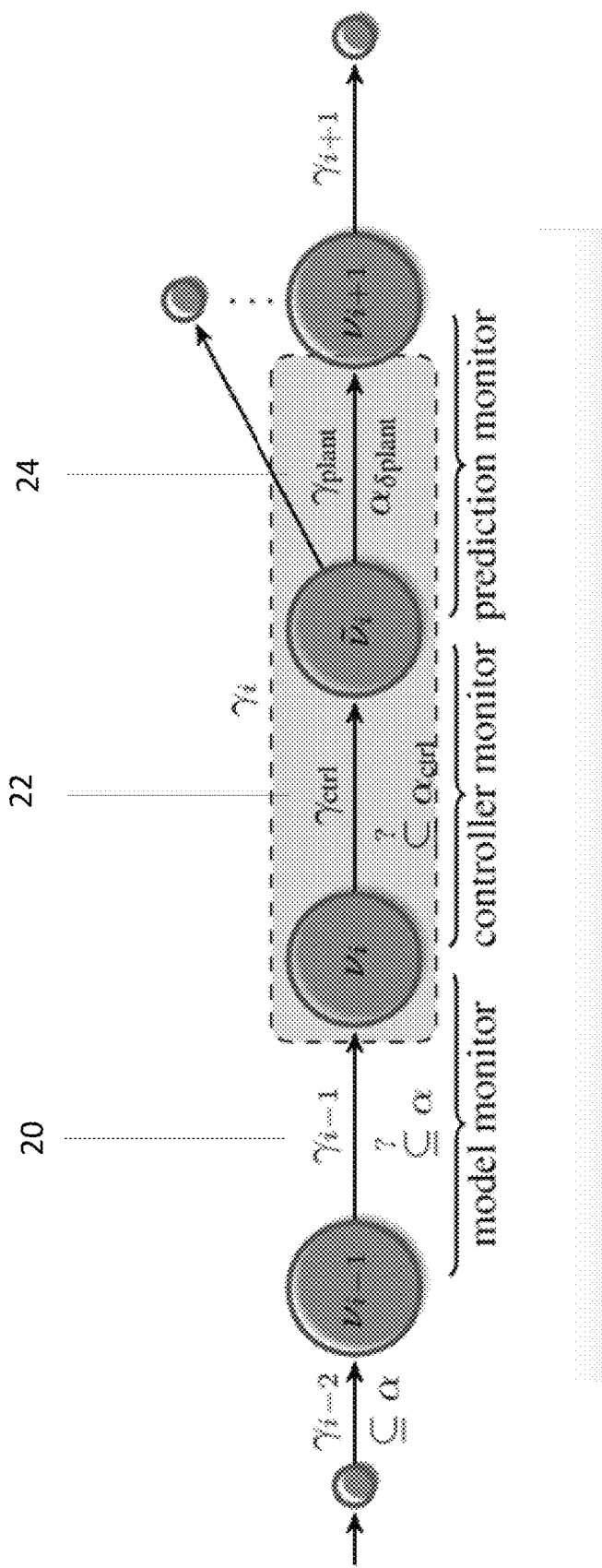
FIG. 1 shows the use of ModelPlex monitors along a system execution.

For hybrid systems verification differential dynamic logic $d\mathcal{L}$ is used, which has a notation for hybrid systems as hybrid programs. $d\mathcal{L}$ allows us to make statements that we want to be true for all runs of a hybrid program ($[\alpha]\emptyset$) or for at least one run $\langle \alpha \rangle \emptyset$ of a hybrid program.

Both constructs are necessary to derive safe monitors: $[\alpha]\emptyset$ proofs are needed to ensure that all behavior of a model (including controllers) is safe; $\langle \alpha \rangle \emptyset$ proofs are needed to find monitor specifications that detect whether or not system execution fits to the verified model.

Table 1 summarizes the relevant syntax fragment of hybrid programs together with an informal semantics. The semantics $\rho(\alpha)$ of hybrid program $\alpha$ is a relation on initial and final states of running $\alpha$. The set of $d\mathcal{L}$ formulas is generated by the following grammar ($< \in \{<, \leq, =, \geq, >\}$, and $\theta_1, \theta_2$ are arithmetic expressions in $+, -, \cdot, /$ over the reals):

$$\Phi ::= \theta_1 \sim \theta_2 | \neg \Phi | \Phi \wedge \psi | \Phi \vee \psi | \Phi \rightarrow \psi | \forall x \Phi | \exists x \Phi | [\alpha]\Phi$$
$$\Phi | \langle \alpha \rangle \Phi$$

Differential dynamic logic comes uses a theorem prover with a verification technique to prove correctness properties of hybrid programs. One example of a theorem prover and the one that is used in the preferred embodiment of the invention is KeYmaera.

TABLE 1

Hybrid program representations of hybrid systems.

| Statement | Effect |
|---|---|
| α; β | sequential composition, first run hybrid program α, then hybrid program β |
| α ∪ β | nondeterministic choice, following either hybrid program α or β |
| α* | nondeterministic repetition, repeats hybrid program α n ≥ 0 times |

TABLE 1-continued

Hybrid program representations of hybrid systems.

| Statement | Effect |
|---|---|
| x := θ | assign value of term θ to variable x (discrete jump) |
| x := * | assign arbitrary real number to variable x |
| ?F | check that a particular condition F holds, and abort if it does not |
| $(x_1' = \theta_1, \ldots, x_n' = \theta_n \& F)$ | evolve $x_i$ along differential equation system $x_i' = \theta_i$ restricted to maximum evolution domain F |

ModelPlex Approach for Verified Runtime Validation

CPS are almost impossible to get right without sufficient attention to prior analysis, for instance by formal verification and formal validation techniques. We assume to be given a verified model of a CPS, i.e. formula (1) is proved valid. Note that differential dynamic logic ($d\mathcal{L}$) and KeYmaera as a theorem prover are used to illustrate the concepts herein. The concept of ModelPlex is not predicated on the use of KeYmaera to prove (1). Other verification techniques could be used to establish validity of this formula. The flexibility of the underlying logic $d\mathcal{L}$, its support for both $[\alpha]\Phi$ and $\langle \alpha \rangle \Phi$, and its proof calculus, however, are exploited for systematically constructing monitors from proofs in the sequel.

$$\Phi \rightarrow [\alpha^*]\psi \text{ with invariant } \varphi \rightarrow [\alpha]\varphi \text{s.t.} \Phi \rightarrow \varphi \text{ and}$$
$$\varphi \rightarrow \psi \quad (1)$$

Formula (1) expresses that all runs of the hybrid system $\alpha^*$, which start in states that satisfy the precondition ø and repeat the model α arbitrarily many times, must end in states that satisfy the post condition ψ. Formula (1) is proved using some form of induction, which shows that a loop invariant φ holds after every run of α if it was true before. The model α is a hybrid system model 100 of a CPS, which means that it describes both the discrete control actions of the controllers in the system and the continuous physics of the plant and the system's environment.

The safety guarantees obtained by proving formula (1) about the model $\alpha^*$ transfer to the real system, if the actual CPS execution fits to $\alpha^*$. Because safety properties should be preserved, a CPS γ fits to a model $\alpha^*$, if the CPS reaches at most those states that are reachable by the model, i.e., $\rho(\gamma) \subseteq \rho(\alpha^*)$. However, we do not know γ and therefore need to find a condition based on $\alpha^*$ that can be checked at runtime to see if concrete runs of γ behave like $\alpha^*$.

Checking the post condition ψ is not sufficient because, if ψ does not hold, the system is already unsafe. Checking the invariant φ is insufficient as well, because if φ does not hold, the controller can no longer guarantee safety, even though the system may not yet be unsafe. But if we detect when a CPS is about to deviate from $\alpha^*$ before leaving φ, we can still switch to a fail-safe controller to avoid ¬ψ from happening.

As shown in FIG. 1, ModelPlex derives three kinds of monitors, a model monitor 20, a controller monitor 22, and a prediction monitor 24. Reachability between consecutive states in α, $\alpha_{ctrl}$, and $\alpha_{\delta plant}$ are checked by verifying states during execution against the corresponding monitor.

Model monitor 20—In each state $v_i$ the sample point $v_{i-1}$ from the previous execution $\gamma_{i-1}$ is tested for deviation from the single α, not $\alpha^*$ i. e., test $(v_{i-1}, v_i) \in \rho(\alpha)$. If violated, other verified properties may no longer hold for the system. The system, however, is still safe if a prediction monitor 24 was satisfied on $v_{i-1}$. Frequent violations indicate an inadequate model that should be revised to better reflect reality.

Controller monitor 22—In intermediate state $\tilde{v}_i$ the current controller decisions of the implementation $\gamma_{ctrl}$ are tested for compliance with the model, i.e., test $(v_i, \tilde{v}_i) \in \rho(\alpha_{ctrl})$. Controller monitors 22 are designed for switching between controllers similar to Simplex. If violated, the commands from a fail-safe controller replace the current controller's decisions to ensure that no unsafe commands are ever actuated.

Prediction monitor 24—In intermediate state $\tilde{v}_i$ the worst-case safety impact of the current controller decisions are tested with respect to the predictions of a bounded deviation plant model $\alpha_{\delta plant}$, which has a tolerance around the model plant $\alpha_{plant}$, i.e., check $v_{i+1} \models \varphi$ for all $v_{i+1}$ such that $(\tilde{v}_i, v_{i+1}) \in \rho(\alpha_{\delta plant})$. Note, that all $v_{i+1}$ are simultaneously checked by checking $\tilde{v}_i$ for a characterizing condition of $\alpha_{\delta plant}$. If violated, the current control choice is not guaranteed to keep the system safe until the next control cycle and, thus, a fail-safe controller takes over.

The assumption for the prediction monitor 24 is that the real execution is not arbitrarily far off the plant models used for safety verification, because otherwise guarantees can neither be made on unobservable intermediate states nor on safety of the future system evolution. A separation of disturbance causes in the models can be used: ideal plant models $\alpha_{plant}$ for correctness verification purposes, implementation deviation plant models $\alpha_{\delta plant}$ for monitoring purposes. Any deviation model (e.g., piecewise constant disturbance, differential inclusion models of disturbance) is supported, as long as the deviation is bounded and differential invariants can be found. It is assumed that monitor evaluations are at most some $\varepsilon$ time units apart (e.g., along with a recurring controller execution). Note that disturbance in $\alpha_{\delta plant}$ is more manageable compared to $\alpha^*$, as single runs $\alpha$ can be focused on instead of repetitions for monitoring.

Relation Between States

A check that inspects states of the actual CPS to detect deviation from the model $\alpha^*$ is systematically derived. First, a notion of state recall is established and shows that, when all previous state pairs comply with the model, compliance of the entire execution can be checked by checking the latest two states $(v_{i-1}, v_i)$.

Definition 1 (State recall). $V$ is used to denote the set of variables whose state we want to recall. $Y_V^- \equiv \wedge_{x \in V} x = x^-$ are used to express a characterization of the values of variables in a state prior to a run of $\alpha$, where the fresh variables $x^-$ to are always presumed to occur solely in $Y_V^-$. The variables in $x^-$ can be used to recall this state. Likewise, $Y_V^+ \equiv \wedge_{x \in V} x = x^+$ is used to characterize the posterior states and expect fresh $x^+$.

With this notation, the following lemma states that an interconnected sequence of $\alpha$ transitions forms a transition of $\alpha^*$.

Lemma 1 (Loop prior and posterior state). Let $\alpha$ be a hybrid program and $\alpha^*$ be the program that repeats arbitrarily many times. Assume that all consecutive pairs of states $(v_{i-1}, v_i) \in \rho(\alpha)$ of $n \in \mathbb{N}^+$ executions, whose valuations are recalled with $Y_V^i \equiv \wedge_{x \in V} x = x^i$ and $Y_V^{i-1}$ are plausible with respect to the model $\alpha$, i.e., $. \models \wedge_{1 \le i \le n} (Y_V^{i-1} \to \langle \alpha \rangle Y_V^i)$ with $Y_V^- = Y_V^0$ and $Y_V^+ = Y_V^n$. Then, the sequence of states originates from an $\alpha^*$ execution from $Y_V^0$ to $Y_V^n$, i.e., $\models Y_V^{31 \to} \langle \alpha^* \rangle Y_V^+$.

Lemma 1 enables us to check compliance with the model $\alpha^*$ up to the current state by checking reachability of a posterior state from a prior state on each execution of $\alpha$ (i.e., online monitoring, which is easier because the loop was eliminated). To find compliance checks systematically, we construct formula (2), which relates a prior state of a CPS to its posterior state through at least one path through the model $\alpha$. Consecutive states for $\alpha^*$ mean before and after executions of $\alpha$ (i.e., $\alpha; \downarrow \alpha; \downarrow \alpha$, not within $\alpha$).

$$Y_V^- \to \langle \alpha \rangle Y_V^+ \quad (2)$$

Formula (2) is satisfied in a state v, if there is at least one run of the model $\alpha$ starting in the state v recalled by $Y_V^-$ and which results in a state $\omega$ recalled using $Y_V^+$. In other words, at least one path through $\alpha$ explains how the prior state v got transformed into the posterior state $\omega$. The $d\mathcal{L}$ formula (2) characterizes the state transition relation of the model $\alpha$ directly. Its violation witnesses compliance violation. Compliance at all intermediate states cannot be observed by real-world sensors. (See Section 'Monitoring Compliance Guarantees for Unobservable Intermediate States' herein).

In principle, formula (2) would be a monitor, because it relates a prior state to a posterior state through the model of a CPS, but the formula is difficult, if not impossible, to evaluate at runtime, because it refers to a hybrid system $\alpha$, which includes non-determinism and differential equations. The basic observation is that any formula that is equivalent to (2) but conceptually easier to evaluate in a state would be a correct monitor 112. We use theorem proving for simplifying formula (2) into quantifier-free first-order real arithmetic form so that it can be evaluated efficiently at runtime. The resulting first-order real arithmetic formula can be easily implemented in a runtime monitor and executed along with the actual controller. A monitor 112 is executable code that only returns true if the transition from the prior system state to the posterior state is compliant with the model 100. Thus, deviations from the model 100 can be detected at runtime, so that appropriate fallback and mitigation strategies can be initiated.

Remark 1. The complexity for evaluating an arithmetic formula over the reals for concrete numbers is linear in the formula size, as opposed to deciding the validity of such formulas, which is doubly exponential. Evaluating the same formula on floating point numbers is inexpensive, but may yield wrong results due to rounding errors; on exact rationals, the bit-complexity can be non-negligible. Interval arithmetic is used to obtain reliable results efficiently.

Example 1

A simple water tank is used as a running example to illustrate the concepts throughout this section. The water tank has a current level x and a maximum level m. The water tank controller, which runs at least every $\varepsilon$ time units, non-deterministically chooses any flow f between a maximum outflow −1 and a maximum $$\frac{m-x}{\varepsilon}.$$

This water tank never overflows, as witnessed by a proof for the following $d\mathcal{L}$ formula.

$$0 \le x \le m \wedge \varepsilon > 0 \to \phi$$

-continued $$\left[\left(f := *; ?\left(-1 \le f \le \frac{m-x}{\varepsilon}\right); t := 0; (x' = f, t' = 1 \& x \ge 0 \wedge t \le \varepsilon)\right)^*\right]$$
$$\underbrace{\phi}_{(0 \le x \le m)}$$

ModelPlex Monitor Synthesis

This section introduces the nature of ModelPlex monitor specifications, the approach in this invention for generating such specifications from hybrid system models, and how to turn those specifications into monitor code that can be executed at runtime along with the controller.

A ModelPlex specification 104 corresponds to the $d\mathcal{L}$ formula (2). If the current state of a system does not satisfy a ModelPlex specification 104, some behavior that is not reflected in the model 100 occurred (e.g., the wrong control action was taken, unanticipated dynamics in the environment occurred, sensor uncertainty led to unexpected values, or the system was applied outside the specified operating environment).

A model monitor $X_m$ checks that two consecutive states $v$ and $w$ can be explained by an execution of the model $\alpha$, i.e., $(v, w) \in \rho(\alpha)$. In the sequel, $BV(\alpha)$ are bound variables in $\alpha$, $FV(\varphi)$ are free variables in $\varphi$, $\Sigma$ is the set of all variables, and $A\setminus B$ denotes the set of variables being in some set A but not in some other set B. Furthermore, we use $v|_A$ to denote v projected onto the variables in A.

Theorem 1 (Model monitor correctness). Let $\alpha^*$ be provably safe, so $\vDash \Phi \rightarrow [\alpha^*]\psi$. Let $V_m = BV(\alpha) \cup FV(\psi)$. Let $v_0, v_1, v_2, v_3 \ldots \in \mathbb{R}^n$ be a sequence of states, with $v_0 \vDash \Phi$ and that agree on $\Sigma \setminus V_m$, i.e., $v_0|_{\Sigma \setminus V_m} = v_k|_{\Sigma \setminus V_m}$ for all k. We define $(v, v_{i+1}) \vDash x_m$ as $x_m$ evaluated in the state resulting from v by interpreting $x^+$ as $v_{i+1}(x)$ for all $x \in V_m$, i.e., $v_{x^+}^{v_{i+1}(x)} \vDash x_m$. If $v_i, v_{i+1}) \vDash x_m$ for all i<n then we have $v_n \vDash \psi$ where $$X_m = (\Phi|_{const} \rightarrow \langle \alpha \rangle Y_{v_m}^+) \quad (3)$$

and $\Phi|_{const}$ denotes the conditions of $\Phi$ that involve only constants that do not change in $\alpha$, i. e., $FV(\varphi|const) \cap BV(\alpha) = \emptyset$.

The approach shown herein to generate monitor specifications from hybrid system models 102 takes a verified $d\mathcal{L}$ formula (1) as input 100 and produces a monitor $x_m$ in quantifier-free first-order form as output. The algorithm involves the following steps:

1. A $d\mathcal{L}$ formula (1) about a model $\alpha$ of the form $\Phi \rightarrow [\alpha^*]\psi$ is turned into a specification conjecture (3) of the form $\Phi|_{const} \rightarrow \langle \alpha \rangle Y_{v_m}^+$. See process 102, resulting in monitor specification 104 in FIG. 3.
2. Theorem proving on the specification conjecture (3) is applied until no further proof rules are applicable and only first-order real arithmetic formulas remain open. See process 106, resulting in monitor conditions 108, containing only first-order logic (FOL) in FIG. 3. Process 106 is also shown in more detail in FIG. 4, and an algorithmic representation of process 106 is shown in Section D herein.
3. The monitor specification $x_m$ is the conjunction of the unprovable first-order real arithmetic formulas from open sub-goals.

Generate the monitor conjecture. $d\mathcal{L}$ formula (1) is mapped syntactically to a specification conjecture of the form (3). By design, this conjecture will not be provable. But the unprovable branches of a proof attempt will reveal information that, had it been in the premises, would make (3) provable. Through $Y_{v_m}^+$, those unprovable conditions collect the relations of the posterior state of model $\alpha$ characterized by $x^+$ to the prior state x, i.e., the conditions are a representation of (2) in quantifier-free first-order real arithmetic.

Example 2

The specification conjecture for the water tank model is given below. It is constructed from the model by removing the loop, flipping the modality, and formulating the specification requirement as a property, since we are interested in a relation between two consecutive states $v$ and $w$ (recalled by $x^+$, $f^+$ and $t^+$). Using theorem proving, we analyze the conjecture to reveal the actual monitor specification 104.

$$\underbrace{\varepsilon \ge 0}_{\phi lowest} \rightarrow$$

$$\underbrace{\left\langle f := *; ?\left(-1 \le f \le \frac{m-x}{\varepsilon}\right); t := 0; (x' = f, t' = 1 \& x \ge 0 \wedge t \le \varepsilon)\right\rangle}_{(x = x^+ \wedge f = f^+ \wedge t = t^+)} Y_{v_m}^+$$

Use theorem proving to analyze the specification conjecture. The proof rules of $d\mathcal{L}$ are used to analyze the specification conjecture $x_m$. These proof rules syntactically decompose a hybrid model 100 into easier-to-handle parts, which leads to sequents with first-order real arithmetic formulas towards the leaves of a proof. Using real arithmetic quantifier elimination we close sequents with logical tautologies, which do not need to be checked at runtime since they always evaluate to true for any input. The conjunction of the remaining open sequents is the monitor specification 104, which implies (2).

A complete sequence of proof rules applied to the monitor conjecture of the water tank is described in below in Section B. Most steps are simple when analyzing specification conjectures: sequential composition ($\langle ; \rangle$), nondeterministic choice ($\langle \cup \rangle$), deterministic assignment ($\langle := \rangle$) and logical connectives ($\wedge$ r etc.) replace current facts with simpler ones or branch the proof. Challenges arise from handling nondeterministic assignment and differential equations in hybrid programs.

First, consider nondeterministic assignment x :=*. The proof rule for non-deterministic assignment ($\langle * \rangle$) results in a new existentially quantified variable. By sequent proof rule $\exists$r, this existentially quantified variable is instantiated with an arbitrary term $\theta$, which is often a new logical variable that is implicitly existentially quantified. Weakening (Wr) removes facts that are no longer necessary.

$$(\langle * \rangle) \frac{\exists X \langle x := X \rangle \phi_1}{\langle x := * \rangle \phi} \quad (\exists r) \frac{\Gamma \vdash \phi(\theta), \exists x \phi(x), \Delta_2}{\Gamma \vdash \exists x \phi(x), \Delta} (Wr) \frac{\Gamma \vdash \Delta}{\Gamma \vdash \phi, \Delta}$$

[1] X is a new logical variable
[2] $\theta$ is an arbitrary term, often a new (existential) logical variable X.

Optimization 1 (Instantiation Trigger). If the variable is not changed in the remaining $\alpha$, $x_i = x_i^+$ is $Y_{v_m}^+$ and X is not bound in $Y_{v_m}^+$, then instantiate the existential quantifier by rule $\exists$r with the corresponding $x_i^+$ that is part of the specification conjecture (i.e., $\theta = x_i^+$), since subsequent proof steps are going to reveal $\theta = x_i^+$ anyway.

Otherwise, a new logical variable is introduced which may result in an existential quantifier in the monitor specification if no further constraints can be found later in the proof.

Example 3

The corresponding steps in the water tank proof use $\langle * \rangle$ for the nondeterministic flow assignment (f:=*) and $\exists r$ to instantiate the resulting existential quantifier $\exists F$ with a new logical variable F (plant is an abbreviation for x'=f, t'=1 & 0≤x ∧ t≤ε). The proof without and with application of Opt. 1 is given as.

$$\langle * \rangle \frac{\exists r, Wr \frac{\phi \vdash \cdots \langle f := F \rangle \langle ?\text{-}1 \leq f \leq \frac{m-x}{z} \rangle \langle \text{plant} \rangle \Upsilon^+}{\phi \vdash \cdots \exists F \langle f := F \rangle \langle ?\text{-}1 \leq f \leq \frac{m-x}{z} \rangle \langle \text{plant} \rangle \Upsilon^+}}{\phi \vdash \cdots \langle f := * ; ?\text{-}1 \leq f \leq \frac{m-x}{z} \rangle \langle \text{plant} \rangle \Upsilon^+} \text{ w/o Opt. 1}$$

$$\exists r, Wr \cdots \frac{\phi \vdash \cdots \langle f := f^* \rangle}{\langle ?\text{-}1 \leq f \leq \frac{m-x}{z} \rangle \langle \text{plant} \rangle \Upsilon^+}$$

with Opt. 1 (anticipate $f = f^*$ from $\Upsilon^+$)

Next, differential equations are handled. Even when the differential equation can be solved, existentially and universally quantified variables remain. Inspect the corresponding proof rule from the $d\mathcal{L}$ calculus. For differential equations it must be proven that there exists a duration t, such that the differential equation stays within the evolution domain H throughout all intermediate times $\tilde{t}$ and the result satisfies φ at the end. At this point there are three options:

i. Option 1: instantiate the existential quantifier, if it is known that the duration will be $t^+$;

ii. Option 2: introduce a new logical variable, which is the generic case that always yields correct results, but may discover monitor specifications that are harder to evaluate;

$$(\langle ' \rangle) \frac{\exists T \geq 0 ((\forall 0 \leq \tilde{t} \leq T \langle x := y(\tilde{t}) \rangle H) \wedge \langle x := y(T) \rangle \phi)_1}{\langle x' = \theta \& H \rangle \phi}$$

$$(QE) \frac{QE(\phi)_2}{\phi}$$

[1] T and $\tilde{t}$ are fresh logical variables and $\langle x := y(T) \rangle$ is the discrete assignment belonging to the solution y of the differential equation with constant symbol x as symbolic initial value

[2] iff $\Phi \equiv QE(\Phi)$, $\Phi$ is a first-order real arithmetic formula, $QE(\Phi)$ is an equivalent quantifier-free formula computable by [7]

iii. Option 3: use quantifier elimination (QE) to obtain an equivalent quantifier-free result (a possible optimization could inspect the size of the resulting formula).

Example 4

In the analysis of the water tank example, the differential equation are solved (see $\langle ' \rangle$) and the substitutions f :=F and t :=0 are applied. In the next step (see $\exists r, Wr$), the existential quantifier $\exists T$ is instantiated with $t^+$ (i.e., $T=t^+$ using Option 1 with the last conjunct) and uses weakening right (Wr) to systematically get rid of the existential quantifier that would otherwise still be left around by rule $\exists r$. Finally, quantifier elimination (QE) is used to reveal an equivalent quantifier-free formula, shown as reference number 108 in FIG. 3.

$$QE \frac{\phi \vdash \cdots F = f^+ \wedge x^+ = x + Ft^+ \wedge t^+ \geq 0 \wedge x \geq 0 \wedge \varepsilon \geq t^+ \geq 0 \wedge Ft^+ + x \geq 0}{\phi \vdash \cdots \forall 0 \leq \tilde{t} \leq T (x + f^+ \tilde{t} \geq 0 \wedge \tilde{t} \leq \varepsilon)) \wedge F = f^+ \wedge x^+ = x + Ft^+ \wedge t^+ = t^+}$$

$$\exists r, Wr \frac{}{\phi \vdash \cdots \exists T \geq 0 ((\forall 0 \leq \tilde{t} \leq T (x + f^+ \tilde{t} \geq 0 \wedge \tilde{t} \leq \varepsilon)) \wedge F = f^+ \wedge (x^+ = x + FT \wedge t^+ = T))}$$

$$(') \frac{}{\phi \vdash \cdots \langle f := F; t := 0 \rangle \langle \{x' = f, t' = 1 \& x \geq 0 \wedge t \leq \varepsilon \} \rangle \Upsilon^+}$$

The analysis of the specification conjecture finishes with collecting the open sequents from the proof to create the monitor specification $x_{m_=}^{def} \wedge$ (open sequent) 104. The collected open sequents may include new logical variables and new (Skolem) function symbols that were introduced for nondeterministic assignments and differential equations when handling existential or universal quantifiers. The invertible quantifier rule i$\exists$ is used to re-introduce existential quantifiers for the new logical variables. Often, the now quantified logical variables are discovered to be equal to one of the post-state variables later in the proof, because those variables did not change in the model after the assignment. If this is the case, proof rule $\exists \sigma$ can be used to further simplify the monitor specification by substituting the corresponding logical variable x with its equal term θ.

$$(i\exists) \frac{\Gamma \vdash \exists X(\wedge_i(\Phi_i \vdash \psi_i)), \Delta_1}{\Gamma, \Phi_1 \vdash \psi_2, \Delta \cdots \Gamma, \Phi_1 \vdash \psi_2, \Delta} \quad (\exists o) \frac{\phi(\theta)_2}{\exists x(x = \theta \wedge \phi(x))}$$

[1] Among all open branches, free logical variable X only occurs in the branches $\Gamma, \Phi, \overset{3}{\forall}, \psi, \Delta$

[2] Logical variable x does not appear in term θ

Example 5

The two open sequents of Examples 3 and 4 use a new logical variable F for the nondeterministic flow assignment f :=*. After further steps in the proof, the assumptions reveal additional information $F=f^+$. Thus, the existential quantifier is re-introduced over all the open branches (i∃) and substitute f⁺ for F (∃σ). The sole open sequent of this proof attempt is the monitor specification $x_m$ of the water tank model.

$$\exists o \frac{\phi \{\cdots -1 \leq f^+ \leq \frac{m-x}{\varepsilon} \wedge x^+ = x + f^+ t^+ \wedge t^+ \geq 0 \wedge x \geq 0 \ldots}{\phi \{\cdots \exists F(-1 \leq F \leq \frac{m-x}{\varepsilon} \wedge F = f^+ \wedge x^+ = x + Ft^+ \wedge t^+ \geq 0 \wedge x \geq 0 \ldots)}$$

$$i\exists \frac{}{\phi \{\cdots -1 \leq F \leq \frac{m-x}{\varepsilon} \quad \phi \{\cdots F = f^+ \wedge x^+ = x + Ft^+ \wedge t^+ \geq 0 \wedge x \geq 0 \ldots}$$

$$0 \leq x \leq m \wedge \varepsilon > 0 \wedge c < 1 \wedge 0 \leq u \wedge 0 < d \rightarrow$$

$$\left[\left(x_s := *; ?(x-u \leq x_s \leq x+u); f := *; ?\left(-1 \leq f \leq \frac{m-x_s-u}{d\varepsilon}(1-c)\right); t := 0; \{x' \leq fd, 1-c \leq t' x \geq 0 \wedge t \leq \varepsilon\}\right)^*\right](0 \leq x \leq m)$$

Controller Monitor Synthesis

Figure 3:
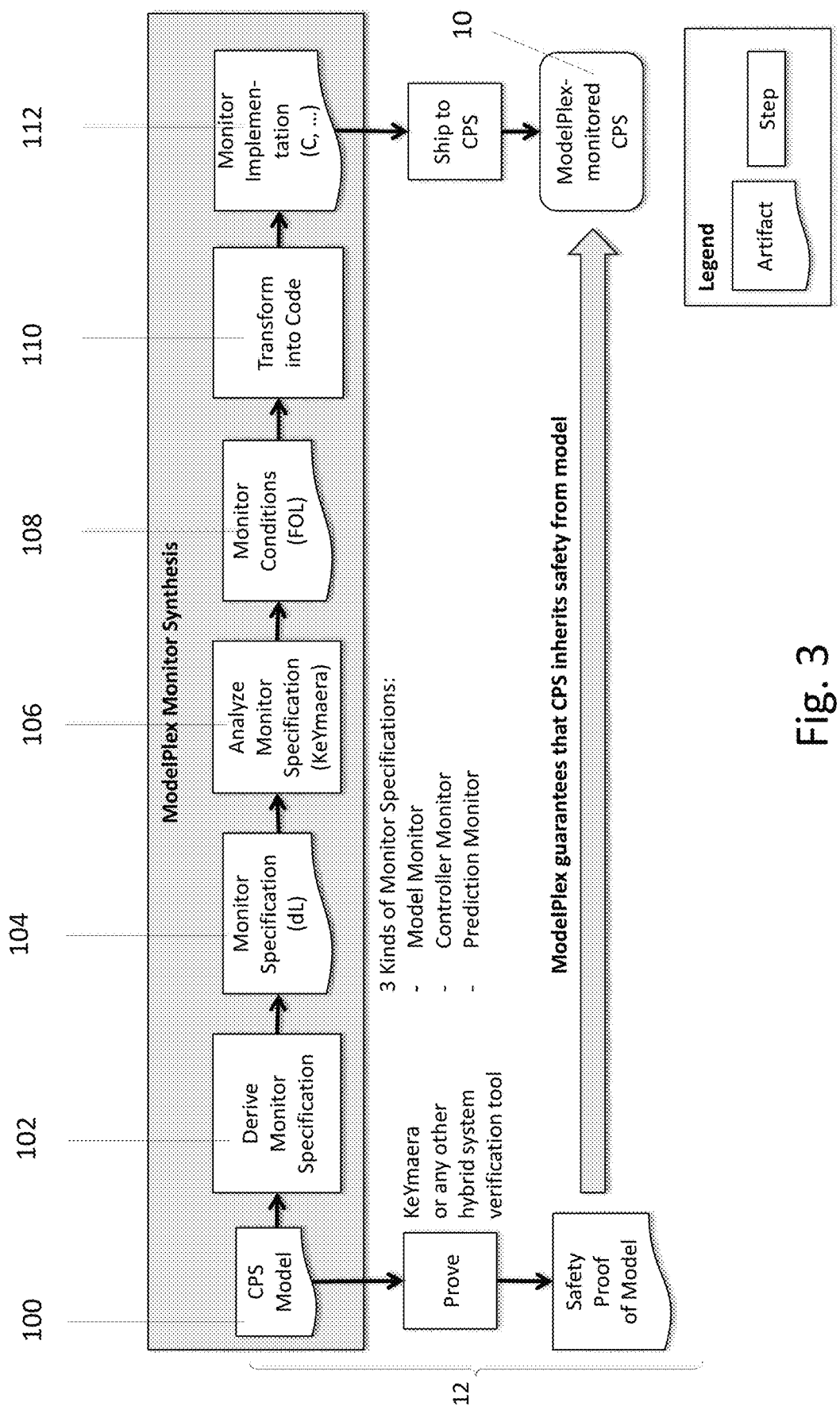
FIG. 3 is a high level flow chart of the process of deriving monitors from a model.

A controller monitor $x_c$, shown as reference number 112 in FIG. 3, checks that two consecutive states v and w are reachable with one controller execution $\alpha_{ctrl}$, i. e., $(\nu, w) \in \rho(\alpha_{ctrl})$ with $V_c, =BV(\alpha_{ctrl}) \cup FV(\psi)$. Controller monitors 112 are systematically derived in processes 106 and 110 from formulas 104: $\varphi|_{const} \rightarrow \langle \alpha_{ctrl} \rangle Y_{V_c}^+$. A controller monitor 112 can be used to initiate controller switching similar to Simplex.

Theorem 2 (Controller monitor correctness). Let α of the canonical form $\alpha_{ctrl}; \alpha_{plant}$ Assume $\models \Phi \rightarrow [\alpha^*]\varphi$ has been proven with invariant $\varphi$ as in (1). Let $v \models \Phi|_{const} \wedge \Phi$, as checked by $x_m$(Theorem 1). Furthermore, let ṽ be a post-controller state. If (v, ṽ) ⊨ $x_c$ with $x_c \equiv \Phi|_{const} \rightarrow \langle \alpha_{ctrl} \rangle Y_{V_c}^+$ then we have that (v, ṽ) ∈ρ($\alpha_{ctrl}$) and ṽ⊨φ.

Monitoring in the Presence of Expected Uncertainty and Disturbance

Up to now exact ideal-world models have been considered. However, real-world clocks drift, sensors measure with some uncertainty, and actuators are subject to disturbance. This makes the exact models safe but too conservative, which means that monitors for exact models are likely to fall back to a fail-safe controller unnecessarily often. This section is a discussion of how ModelPlex specifications are found such that the safety property (1) and the monitor specification become more robust to expected uncertainty and disturbance. That way, only unexpected deviations beyond those captured in the normal operational uncertainty and disturbance of α* cause the monitor to initiate fail-safe actions.

In d$\mathcal{L}$ we can, for example, use nondeterministic assignment from an interval to model sensor uncertainty and piecewise constant actuator disturbance, or differential inequalities for actuator disturbance. Such models include non-determinism about sensed values in the controller model and often need more complex physics models than differential equations with polynomial solutions.

Example 6

Clock drift, sensor uncertainty and actuator disturbance are incorporated into the water tank model to express expected deviation. The measured level x, is within a known sensor uncertainty u of the real level x (i.e. x ∈[x−u, x+u]). Differential inequalities are used to model clock drift and actuator disturbance. The clock, which wakes the controller, is slower than the real time by at most a time drift of c; it can be arbitrarily fast. The water flow disturbance is at most d, but the water tank is allowed to drain arbitrarily fast (even leaks when the pump is on). To illustrate different modeling possibilities, we use additive clock drift and multiplicative actuator disturbance.

Example6 can be analyzed in the same way as the previous examples, with the crucial exception of the differential inequalities. The proof rule (′) cannot be used to analyze this model, because differential inequalities do not have polynomial solutions. Instead, the DR and DE proof rules of d$\mathcal{L}$ are used to turn differential inequalities into a differential-algebraic constraint form that lets us proceed with the proof. Rule DE turns a differential inequality x′≤θ into a quantified differential equation ∃d̃(x′=d̃ & d̃≤θ) with an equivalent differential-algebraic constraint. Rule DR turns a differential-algebraic constraint $\mathcal{E}$ into another differential-algebraic constraint $\mathcal{D}$, which implies $\mathcal{E}$, written $\mathcal{D} \rightarrow \mathcal{E}$.

$$\forall X (\exists \bar{d}(X = \bar{d} \wedge \bar{d} \leq \theta \wedge H) \rightarrow$$

$$(DR)\frac{\mathcal{D} \rightarrow \delta(\mathcal{D})\phi_1}{(\delta)\phi} \quad (DE)\frac{X \leq \theta \wedge H)(\exists \bar{d}(x' = \bar{d} \ \& \ \bar{d} \leq \theta \wedge H))\phi_2}{(x' \leq \theta \ \& \ H)\phi}$$

[1] differential refinement: differential-algebraic constraints $\mathcal{D}, \mathcal{E}$ have the same changed variables
[2] differential inequality elimination: special case of DR, which rephrases the differential inequalities≤as differential-algebraic constraints (accordingly for other or mixed inequalities systems).

Currently, for finding model monitors, our prototype tool solves differential equations by the proof rule ('). Thus, it finds model monitor specifications for differential algebraic equations with polynomial solutions and for differential algebraic inequalities, which can be refined into solvable differential algebraic equations as in Example 6. For prediction monitors (discussed in Section below) d$\mathcal{L}$ techniques are used for finding differential variants and invariants, differential cuts, and differential auxiliaries to handle differential equations and inequalities without polynomial solutions.

Monitoring Compliance Guarantees for Unobservable Intermediate States

With controller monitors, non-compliance of a controller implementation with respect to the modeled controller can be detected right away. With model monitors, non-compliance of the actual system dynamics with respect to the modeled dynamics can be detected when they first occur. In such cases, a fail-safe action is switched to, which is verified using standard techniques, in both non-compliance cases. The crucial question is: can such a method always guarantee safety? The answer is linked to the image computation problem in model checking (i. e., approximation of states reachable from a current state), which is known to be not semi-decidable by numerical evaluation at points; approximation with uniform error is only possible if a bound is known for the continuous derivatives. This implies that additional assumptions are needed about the deviation between the actual and the modeled continuous dynamics to guarantee compliance for unobservable intermediate states. Unbounded deviation from the model between sample points just is unsafe, no matter how hard a controller tries. Hence, worst-case bounds capture how well reality is reflected in the model.

A prediction monitor is derived to check whether a current control decision will be able to keep the system safe for time s even if the actual continuous dynamics deviate from the model. A prediction monitor checks the current state, because all previous states are ensured by a model monitor and subsequent states are then safe by (1).

Definition 2 ($\varepsilon$-bounded plant with disturbance $\delta$). Let $\alpha_{plant}$ be a model of the form x'=$\theta$& H. An $\varepsilon$-bounded plant with disturbance $\delta$, written $\alpha_{\delta plant}$, is a plant model of the form $x_o := 0; (f(\theta, \delta) \leq x' \leq g(\theta, \delta)$ & H $\wedge x_o \leq \varepsilon)$ for some f, g with fresh variable $\varepsilon > 0$ and assuming $x_o' = 1$. That disturbance $\delta$ is constant if $x \in \delta$; it is additive if $f(\theta, \delta) = \theta - \delta$ and $g(\theta, \delta) = \theta + \delta$.

Theorem 3 (Prediction monitor correctness). Let $\alpha^*$ be provably safe, i. e., $\models \Phi \rightarrow [\alpha^*]\psi$ has been proved using invariant $\varphi$ as in (1). Let $V_p = BV(\alpha) \cup FV([\alpha]\varphi)$. Let $\nu \models \Phi|_{const} \wedge \varphi$, as checked by $X_m$ from Theorem 1. Further assume $\tilde{\nu}$ such that $(\nu, \tilde{\nu}) \in \rho(\alpha_{ctrl})$, as checked by $X_c$ from Theorem 2. If $(\nu, \tilde{\nu}) \models X_p$ with $X_p \equiv (\Phi|_{const} \wedge \varphi) \rightarrow \langle \alpha_{ctrl} \rangle (Y_{V_p}^+ \wedge [\alpha_{\delta plant}]\varphi)$, then we have for all $(\tilde{\nu}, \omega) \in \rho(\alpha_{\delta plant})$ that $\omega \models \varphi$.

Decidability and Computability

One useful characteristic of ModelPlex beyond soundness is that monitor synthesis is computable, which yields a synthesis algorithm, and that the correctness of those synthesized monitors with respect to their specification is decidable. See Theorem 4.

Theorem 4 (Monitor correctness is decidable and monitor synthesis computable). Assume canonical models of the form $\alpha \equiv \square \alpha_{ctrl}; \alpha_{plant}$ without nested loops, with solvable differential equations in $\alpha$plant and disturbed plants $\alpha_{\delta plant}$ with constant additive disturbance $\delta$ (see Definition. 2). Then, monitor correctness is decidable, i. e., the formulas $X_m \rightarrow \langle \alpha \rangle Y_V^+$, $X_c \rightarrow \langle \alpha_{ctrl} \rangle Y_V^+ \gamma_V^+$, and $X_p \rightarrow \langle \alpha_{ctrl} \rangle (Y_V^+ \wedge [\alpha_{\delta plant}]\varphi)$ are decidable. Also, monitor synthesis is computable, i. e., the functions $synth_m$: $\langle \alpha \rangle Y_V^+ \rightarrow X_m$, $synth_c$: $\langle \alpha_{ctrl} \rangle Y_V^+ \rightarrow X_c$ and $synth_p$: $\langle \alpha_{ctrl} \rangle (Y_V^+ \wedge [\alpha_{\delta plant}]\varphi) \rightarrow X_p$ are computable.

Evaluation

A software prototype was developed and integrated into the modeling tool Sphinx to automate many of the described steps. The prototype generates $X_m$, $X_c$, and $X_p$ conjectures from hybrid programs, collects open sequents, and interacts with KeYmaera.

To evaluate the method, we created monitors for prior case studies of non-deterministic hybrid models of autonomous cars, train control systems, and robots, for example, adaptive cruise control, intelligent speed adaptation, the European train control system, and ground robot collision avoidance. Table 2 summarizes the evaluation. For the model, the dimension in terms of the number of function symbols and state variables is listed, as is the size of the safety proof (i. e., number of proof steps and branches).

TABLE 2

Monitor complexity case studies

| | | Model | | Monitor | | | |
|---|---|---|---|---|---|---|---|
| | | | proof size | | steps (open seq.) | proof steps | |
| | Case Study | dim. | (branches) | dim. | w/Opt. 1 | auto | (branches) | size |
| $X_m$ | Water tank | 5 | 38 (4) | 3 | 16 (2) | 20 (2) | 64 (5) | 32 |
| | Cruise control [18] | 11 | 969 (124) | 7 | 127 (13) | 597 (21) | 19514 (1058) | 1111 |
| | Speed limit [23] | 9 | 410 (30) | 6 | 487 (32) | 5016 (126) | 64311 (2294) | 19850 |
| $X_c$ | Water tank | 5 | 38 (4) | 1 | 12 (2) | 14 (2) | 40 (3) | 20 |
| | Cruise control [18] | 11 | 969 (124) | 7 | 83 (13) | 518 (106) | 5840 (676) | 84 |
| | Robot [22] | 14 | 3350 (225) | 11 | 94 (10) | 1210 (196) | 26166 (2854) | 121 |
| | ETCS safety [35] | 10 | 193 (10) | 13 | 162 (13) | 359 (37) | 16770 (869) | 153 |
| $X_p$ | Water tank | 8 | 80 (6) | 1 | 135 (4) | N/A | 307 (12) | 43 | http://www.cs.cmu.edu/~smitsch/resource/modelplex_study.zip

Remark 2. By adding a controller execution $\langle \alpha_{ctrl} \rangle$ prior to the disturbed plant model, we synthesize prediction monitors that take the actual controller decisions into account. For safety purposes, a monitor definition without controller $X_p \equiv (\Phi|_{const} \wedge \varphi) \rightarrow [\alpha_{\delta plant}]\varphi$ could be used, but doing so results in a conservative monitor, which has to keep the CPS safe without knowledge of the actual controller decision.

For the monitor, the dimension of the monitor conjecture is listed in terms of the number of variables. The number of steps and open sequents are compared when deriving the monitor using manual proof steps to apply Option 1 and fully automated w/o Option 1, and the number of steps in the monitor correctness proof. Finally, the monitor size in terms of arithmetic, comparison, and logical operators in the monitor formula is listed.

Although the number of steps and open sequents differ significantly between manual interaction for Option 1 and fully automated synthesis, the synthesized monitors are logically equivalent. But applying Option 1 usually results in structurally simpler monitors, because the conjunction over a smaller number of open sequents (See Table 2) can still be simplified automatically. The model monitors for cruise control and speed limit control are significantly larger than the other monitors, because their size already prevents automated simplification by Mathematica. As future work, KeYmaera will be adapted to allow user-defined tactics to apply Option 1 automatically.

A. Proofs

A.1 Formal Semantics of d$\mathcal{L}$

ModelPlex bases on a reachability relation semantics instead of trace semantics, since it is easier to handle and suffices for checking at sample points.

The semantics of d$\mathcal{L}$, as defined in [27], is a Kripke semantics in which states of the Kripke model are states of the hybrid system. Let $\mathbb{R}$ denote the set of real numbers. A state is a map $v: V \to \mathbb{R}$; the set of all states is denoted by Sta. We write $v \models \Phi$ if formula $\Phi$ is true at state $v$ (Def. 4). Likewise, $[\![\theta]\!]_v$ denotes the real value of term $\theta$ at state $v$. The semantics of HP $\alpha$ is captured by the state transitions that are possible by running $\alpha$. For continuous evolutions, the transition relation holds for pairs of states that can be interconnected by a continuous flow respecting the differential equation and invariant region. That is, there is a continuous transition along $x'=\theta$ & H from state $v$ to state $w$, if there is a solution of the differential equation $x'=\theta$ that starts in state $v$ and ends in $w$ and that always remains within the region H during its evolution.

Definition 3 (Transition semantics of hybrid programs). The transition relation $\rho$ specifies which state $w$ is reachable from a state $v$ by operations of $\alpha$. It is defined as follows.

1. $(v,\omega) \in \rho(x:=\theta)$ iff $[\![z]\!]_v = [\![z]\!]_\omega$ f·a·z≠x and $[\![x]\!]_\omega = [\![\theta]\!]_v$.
2. $(v,\omega) \in \rho(x:=*)$ iff $[\![z]\!]_v = [\![z]\!]_\omega$ f·a·z≠x.
3. $(v,\omega) \in \rho(?\varphi)$ iff $v=\omega$ and $v \models \varphi$.
4. $(v,\omega) \in \rho(x'_1=\theta_1, \ldots, x'_n=\theta_n \& H)$ iff for some r≤0, there is a (flow) function $\varphi:[0,r] \to$ Sta with $\varphi(0)=v, \varphi(r)=\omega$, such that for each time $\zeta \in [0, r]$:
   (i) The differential equation holds, i.e., $$\frac{d[x]_w}{dt}(\zeta) = \|\theta_i\|_{\psi(\zeta)}$$

for each $x_i$. (ii) For other variables $y \notin \{x_1, \ldots, x_n\}$ the value remains constant, i.e., $[\![y]\!]_{\varphi(\zeta)} = [\![y]\!]_{\varphi(0)}$.
   (iii) The invariant is always respected, i.e., $\varphi(\zeta) \models H$.
5. $\rho(\alpha \cup \beta) = \rho(\alpha) \cup \rho(\beta)$
6. $\rho(\alpha;\beta) = \{(v,\omega):(v,z) \in \rho(\alpha), (z,\omega) \in \rho(\beta)$ for a state z$\}$
7. $\rho(\alpha^*) = \cup_{n \in \mathbb{N}} \rho(\alpha^n)$ where $\alpha^{i+1} \triangleq (\alpha;\alpha^i)$ and $\alpha^0 \triangleq$ ?true.

Definition 4 (Interpretation of d$\mathcal{L}$ formulas). The interpretation $\models$ of a d$\mathcal{L}$ formula with respect to state $v$ is defined as follows.

1. $v \models \theta_1 \sim \theta_2$ iff $[\![\theta_1]\!] \sim [\![\theta_2]\!]$ for $\sim \in \{\leq, <, \geq, >\}$
2. $v \models \varphi \wedge \Phi$ iff $v \models \Phi$ and $v \models \psi$, accordingly for $\neg, \vee, \to, \leftrightarrow$ 3. $v \models \forall x \varphi$ iff $\omega \models \Phi$ for all $\omega$ that agree with $v$ except for the value of x
4. $v \models \exists x \Phi$ iff $\omega \models \Phi$ for some $\omega$ that agrees with $v$ except for the value of x
5. $v \models [\alpha]\Phi$ iff $\omega \models \Phi \forall \omega$ with $(v, \omega) \in \rho(\alpha)$
6. $v \models \langle\alpha\rangle\Phi$ iff $w \models \exists w$ with $(v, \omega) \in \rho(\alpha)$ We write $\models \Phi$ to denote that $\Phi$ is valid, i.e., that $v \models \Phi \forall v$.

A.2 Soundness

We recall Lemma 1.

Lemma 1 (Loop prior and posterior state). Let $\alpha$ be a hybrid program and $\alpha^*$ be the program that repeats $\alpha$ arbitrarily many times. Assume that all consecutive pairs of states $(v_{i-1}, V_i) \in \rho(\alpha)$ of $n \in \mathbb{N}^+$ executions, whose valuations are recalled with $Y_V^i \equiv \wedge_{x \in V} x = x^{i \text{ and } Y_V^{i-1}}$ are plausible w.r.t. the model $\alpha$, i.e., $\models \wedge_{1 \leq i \leq n}(Y_V^{i-1} \to \langle\alpha\rangle Y_V^i)$ with $Y_V^- = Y_V^0$ and $Y_V^+ = Y_V^n$. Then, the sequence of states originates from an $\alpha^*$ execution from $Y_V^0$ to $Y_V^n$, i.e., $\models Y_V^- \to \langle\alpha^*\rangle Y_V^+$.

Proof. Follows directly from the transition semantics of $\alpha^*$: $\rho(\alpha^*) = \cup_{n \in \mathbb{N}} \rho(\alpha^n)$ where $\alpha^{i+1} \triangleq (\alpha; \alpha^i)$ and $\alpha^0 \triangleq$ ? true.

We recall Theorem 1.

Theorem 1 (Model monitor correctness). Let $\alpha^*$ be provably safe, so $\models \Phi \to [\alpha^*]\psi$. Let $V_m = BV(\alpha) \cup FV(\psi)$. Let $v_0, v_1, v_2, v_3 \ldots \in \mathbb{R}^n$ be a sequence of states, with $v_0 \models \Phi$ and that agree on $\Sigma/V_m$, i.e., $v_0|_{\Sigma/V_m} = v_k|_{\Sigma/V_m}$ for all k. We define $(v, v_{i+1}) \models x_m$ as $x_m$ evaluated in the state resulting from $v$ by interpreting $x^+$ as $v_{i+1}(x)$ for all $x \in V_m$, i.e., $v_{x^+}^{v_{i+1}(x)} \models x_m$. If $v_i, v_{i+1} \models x_m$ for all i< n then we have $v_n \models$ where $$X_m \equiv (\Phi|_{const} \to \langle\alpha\rangle Y_{V_m}^+) \qquad (3)$$

and $\Phi|_{const}$ denotes the conditions of $\Phi$ that involve only constants that do not change in $\alpha$, i.e., FV $(\Phi|_{const}) \cap BV(\alpha) = \emptyset$.

Proof. By induction over n. If n=0 then $(v_0, v_0) \in \rho(\alpha^*)$ trivially by definition of $\rho$ and $\models \Phi \to [\alpha^*]\psi$ implies $v_0 \models \psi$. For n>0 assume $(v_0, v_n) \models \rho(\alpha^*)$ and $(v_n, v_{n+1}) \models \langle\alpha\rangle \wedge_{x \in V_m} x=x^+$. Then there exists $\mu$ such that $(v_{n_+}^{v_{n+1}(x)}, \mu) \in \rho(\alpha)$ and the two states agree on all variables except the ones modified by $\alpha$, i.e., $v_{n_+}^{v_{n+1}(x)}|_{\Sigma/BV(\alpha)} = \mu|_{\Sigma/BB(\alpha)}$. Thus, $\mu \models Y_{V_m}^+$, i.e. $\mu \models \wedge_{x \in V_m} x = x^+$, which in turn yields $\mu(x) = \mu (x^+) = (v_{n_+}^{v_{n+1}(x)})(x^+) = v_{n+1}(x)$ (in other words, $\mu|V_m = v_{n+1}|V_m$). Since also $v_n|_{\Sigma/V_m}$ we get $\mu = v_{n+1}$ and $(v_n, v_{n+1}) \in \rho(\alpha)$. Hence $(v_0, v_{n+1}) \in \rho(\alpha^*)$ because by induction hypothesis $(v_0, v_n) \in \rho(\alpha^*)$ and we conclude $v_{n+1} \models \psi$ by assumption $\models \Phi \to [\alpha]\psi$ using $v_0 \models \Phi$.

We recall Theorem 2.

Theorem 2 (Controller monitor correctness). Let $\alpha$ of the canonical form $\alpha_{ctrl}; \alpha_{plant}$. Assume $\models \Phi \to [\alpha^*]\psi$ has been proven with invariant $\varphi$ as in (1). Let $\models \Phi|_{const} \wedge \psi$, as checked by $x_m$ (Theorem 1). Furthermore, let $\tilde{v}$ be a postcontroller state. If $(v, \tilde{v}) \models X_c$ with $X_c \equiv \Phi|_{const} \to \langle\alpha_{ctrl}\rangle Y_{V_c}^+ =$ then we have that $(v, \tilde{v}) \in \rho(\alpha_{ctrl})$ and $\tilde{v} \models \varphi$.

Proof. Consider a state $v \models \Phi|_{const} \wedge \varphi$. Assume $(v, \tilde{v}) \models X_c$, i.e., $v_{x^+}^{\tilde{v}(x)} \models X_c$. Then there exists $\mu$ such that $v_{x^+}^{\tilde{v}(x)}, \mu) \in \rho(\alpha_{ctrl})$ and the two states agree on all variables except the ones modified by $\alpha_{ctrl}$, i.e., $v_{x^+}^{\tilde{v}(x)}|_{\Sigma/BV}(\alpha_{ctrl})) = \mu|_{\Sigma/BV}(\alpha_{ctrl})$. Thus $\models Y_{V_c}^+$, i.e., $\mu \models \wedge_{x \in V_c} x = x^+$, which in turn yields $\mu(x) = \mu(x^+) = v_{x^+}^{\tilde{v}(x)}(x^+) = \tilde{v}(x)$ (in other words, $\mu|V_c = \tilde{v} V_c$). Since also $\mu|_{\Sigma/V_c} = \tilde{v}_{\Sigma/V_c}$ we get $\mu = \tilde{v}$ and $(v, \tilde{v}) \in \rho(\alpha_{ctrl})$. Then we have $\tilde{v} \models \varphi$ because by assumption $\varphi \to [\alpha_{ctrl}; \alpha_{plant}]\varphi \rho(\alpha_{plant})$ is reflexive as ODE can evolve for time 0.

We recall Theorem 3.

Theorem 3 (Prediction monitor correctness). Let $\alpha^*$ be provably safe, i.e., $\vDash \Phi \rightarrow [\alpha^*]\psi$ has been proved using invariant $\varphi$ as in (1.) Let $V_p = BV(\alpha) \cup FV([\alpha]\varphi)$. Let $\vDash \Phi|_{const} \wedge \varphi$, as checked by $X_m$ from Theorem 1. Further assume $\tilde{v}$ such that $(v, \tilde{v}) \in \rho(\alpha_{ctrl})$, as checked by $X_c$ from Theorem 2. If $(v, \tilde{v}) \vDash X_p$ with $X_p \equiv (\Phi|_{const} \wedge \varphi) \rightarrow \langle \alpha_{ctrl} \rangle Y_{V_p}{}^+ \wedge [\alpha_{\delta plant}]\varphi)$, then we have for all $(\tilde{v}, w) \in \rho(\alpha_{\delta plant})$ that $w \vDash \varphi$.

Proof. Consider a state $v$ such that $\vDash \Phi|_{xonst} \wedge \varphi$. Let $\tilde{v}$ be some state such that $(v, \tilde{v}) \in \rho(\alpha_{ctrl})$. Then we have $\tilde{v} \vDash \varphi$ because by assumption $\varphi \rightarrow [\alpha_{ctrl}; \alpha_{plant}]\varphi$ and $\rho(\alpha_{\delta plant})$ is reflexive as ODE can evolve for time 0. Furthermore $\tilde{v} \vDash \Phi|_{const}$ since $v|_{\Sigma/BV}(\alpha_{ctrl}) = \tilde{v}|_{\Sigma/BV}(\alpha_{ctrl})$ and $FV(\Phi|_{const}) \cap BV(\alpha_{ctrl}) = \emptyset$. Assume $(v, \tilde{v}) \vDash X_p$, i.e., $v_{x^+}^{\tilde{v}(x)} \vDash X_p$. Then there exists $\mu$ such that $\mu \vDash Y_{V_p}{}^+ \wedge [\alpha_{\delta plant}]\varphi$ with $(v_{x^+}^{\tilde{v}(x)}, \mu) \in \rho(\alpha_{ctrl})$ and the two states agree on all variables except the ones modified by $\alpha_{ctrl}$, i.e., $v_{x^+}^{\tilde{v}(x)}|_{\Sigma/BV}(\alpha_{ctrl}) = \mu|_{\Sigma/BV}(\alpha_{ctrl})$. Thus $\mu(x) = \mu(x^+) = v_{x^+}^{\tilde{v}(x)}(x^+) = \tilde{v}(x)$. (in other words, $\mu|V_p = \tilde{v}|V_p$). However, from $X_p$ we know that $\mu \vDash [\alpha_{\delta plant}]\varphi$. Thus, by the coincidence lemma, $\tilde{v} \vDash [\alpha_{\delta plant}]\varphi$ since $FV([\alpha_{\delta plant}]\varphi) \subseteq V_p$ and hence we have $w \vDash \varphi$ for all $(\tilde{v}, w) \in \rho(\alpha_{\delta plant})$.

Observe that this is also true for all intermediate times $\varsigma \in [0, \omega(t)]$ by the transition semantics of differential equations, where $\omega(t) \leq \in$ because $\alpha_{\delta plant}$ is bounded by $\in$.

A.3 Decidability and Computability

From Lemma 1 it follows that online monitoring (i.e., monitoring the last two consecutive states) is permissible. So, ModelPlex turns questions $[\alpha^*]\Phi$ and $\langle a^* \rangle \Phi$ into $[\alpha]\Phi$ and $\langle \alpha \rangle \Phi$, respectively. For decidability, we first consider canonical hybrid programs $\alpha$ of the form $\alpha \equiv \alpha_{ctrl}; \alpha_{plant}$ where $\alpha_{ctrl}$ and $\alpha_{plant}$ are free of further nested loops.

We split Theorem 4 (decidability and computability) into Theorem 5 (decidability) and Theorem 6 (computability) and prove them separately. To handle differential inequalities in $d\mathcal{L}$ formulas of the form $[\alpha_{\delta plant}]\Phi$, the subsequent proofs additionally assume the rules for handling differential-algebraic equations in the $d\mathcal{L}$ calculus.

Theorem 5 (Monitor correctness is decidable). Monitor correctness is decidable for canonical models of the form $\alpha \equiv \alpha_{ctrl}; \alpha_{plant}$ without nested loops, with solvable differential equations in $\alpha_{plant}$ and disturbed plans $\alpha_{\delta plant}$ with constant additive disturbance $\delta$ i.e., $X_m \rightarrow \langle \alpha \rangle Y_V{}^+, X_c \rightarrow \langle \alpha_{ctrl} \rangle Y_V{}^+$, and $X_p \rightarrow \langle \alpha \rangle Y_V{}^+ \wedge [\alpha_{plant}]\Phi)$ are decidable.

Proof. From relative decidability of $d\mathcal{L}$ (i.e., $d\mathcal{L}$ formulas without free variables) are decidable relative to an oracle for discrete loop invariants/variants and continuous differential invariants/variants. Since neither $\alpha_{ctrl}$ nor $\alpha_{plant}$ contain nested loops, we manage without an oracle for loop invariants/variants. Further, since the differential equation systems in $\alpha_{plant}$ are solvable, we have an effective oracle for differential invariants/variants. Let $Cl_\forall(\Phi)$ denote the universal closure of $d\mathcal{L}$ formula $\Phi$ (i.e., $Cl_\forall(\Phi) \equiv \forall_{z \in FV(\Phi)} z . \Phi$). Note that when $\vDash F$ then also $\vDash Cl_\forall(F)$ by a standard argument.

Model monitor $X_m \rightarrow \langle \alpha \rangle Y_V{}^+$: Follows from relative decidability of $d\mathcal{L}$, because $Cl_\forall(X_m \langle \alpha \rangle Y_V{}^+)$ contains no free variables.

Controller monitor $X_c \rightarrow \langle \alpha_{ctrl} \rangle Y_V{}^+$: Follows from relative decidability of $d\mathcal{L}$, because $Cl_\forall(X_c \rightarrow \langle \alpha_{ctrl} \rangle Y_V{}^+)$ contains no free variables.

Prediction monitor $X_p \langle \alpha_{ctrl} \rangle (Y_V{}^+ \wedge [\alpha_{\delta plant}]\Phi)$:-Decidability for $\alpha_{ctrl}$ follows from case $X_c \rightarrow \langle \alpha_{ctrl} \rangle Y_V{}^+$ (controller monitor) above. It remains to show decidability of $X_p \rightarrow \langle \alpha_{ctrl} \rangle [\alpha_{\delta plant}]\Phi$, which by decidability of the controller monitor is $(X_p \wedge Y_V{}^+) \rightarrow [\alpha_{plant}]\Phi$. Since the disturbance $\delta$ in $\alpha_{\delta plant}$ is constant additive and the differential equations in $\alpha_{plant}$ are solvable, we have the disturbance functions $f(\theta, \delta)$ and $g(\theta, \delta)$ applied to the solution as an oracle (By design, the disturbed plant $\alpha_{\delta plant}$ also includes a clock $x_0$, so the oracle additionally includes the trivial differential invariant $x_0 \geq 0$) for differential invariants (i. e., the differential invariant is a pipe around the solution without disturbance). Specifically, to show $(X_p \wedge Y_V{}^+) \rightarrow [\alpha_{\delta plant}]\Phi$ by Def. 2 we have to show $(X_p \wedge Y_V{}^+) \rightarrow [x_0 := 0; \{\theta - \delta \leq x' \leq \theta + \delta \& H \wedge x_0 \leq \varepsilon\}]\Phi$ We proceed with only $(X_p \wedge Y_V{}^+) \rightarrow [x_0 := 0\{x' \leq \theta + \delta \& H \wedge x_0 \leq \varepsilon\}]\Phi$ p since the case $\theta - \delta \leq x'$ follows in a similar manner. By definition of $\alpha_{\delta plant}$ we know $0 \leq x_0$, and hence continue with $(X_p \wedge Y_V{}^+) \rightarrow [\{x' \leq \theta + \delta \& H \wedge 0 \leq x_0 \leq \varepsilon\}]\Phi$ by differential cut rule. Using the differential cut rule, we further supply the oracle $sol_x + \delta x_0$, where $sol_x$ denotes the solution of $x' = \theta$ in $\alpha_{plant}$ and $\delta x_0$ the solution for the disturbance since $\delta$ is constant additive. This leads to two proof obligations:

Prove oracle $(X_p \wedge Y_V{}^+) \rightarrow [x' \leq \theta + \delta \& 0 \leq x_0 \leq \varepsilon] x \leq sol_x + \delta x_0$, which by rule differential invariant is valid if we can show $0 \leq x_0 \leq \varepsilon \rightarrow x' \leq sol'_x + (\delta x_0)'$ where the primed variables are replaced with the respective right-hand side of the differential equation system. From Def. 2 we know that $x'_0 = 1$ and $\delta' = 0$ and since $sol_x$ is the solution of $x' = \theta$ in $\alpha_{plant}$ we further know that $sol'_x = \theta$; hence we have to show $0 \leq x_0 \leq \varepsilon \rightarrow \theta + \delta \leq \theta + \delta$, which is trivially true.

Use oracle $(X_p \wedge Y_V{}^+) \rightarrow [x' \leq \theta + \delta \& H \wedge 0 \leq x_0 \leq \varepsilon \wedge x \leq sol_x + \delta x_0]\varphi$, which by rule differential weaken is valid if we can show $$(X_p \wedge Y_V{}^+) \rightarrow \forall^\alpha ((H \wedge 0 \leq x_0 \leq \varepsilon \wedge x \leq sol_x + \delta x_0) \rightarrow \Phi)$$

where $\forall^\alpha$ denotes the universal closure w.r.t. x, i. e., $\forall x$. But, if $X_p$ is a correct monitor, this is provable by quantifier elimination. Furthermore, we cannot get a better result than differential weaken, because the evolution domain constraint contains the oracle's answer for the differential equation system, which characterizes exactly the reachable set of the differential equation system.

We conclude that the oracle is proven correct and its usage is decidable.

For computability, we start with a theoretical proof on the basis of decidability, before we give a constructive proof, which is more useful in practice.

Theorem 6 (Monitor synthesis is computable). Synthesis of $X_m$, $X_c$, and $X_p$ monitors is computable for canonical models of the form $\alpha \equiv \alpha_{ctrl}; \alpha_{plant}$ without nested loops, with solvable differential equations in $\alpha_{plant}$ and plants $\alpha_{\delta plant}$ with constant additive disturbance $\delta$, i. e., $synth_m$: $\langle \alpha \rangle Y_V{}^+ \rightarrow X_m$, $synth_c$: $\langle \alpha_{ctrl} \rangle Y_V{}^+ \rightarrow X_c$, and $synth_p$: $\langle \alpha \rangle (Y_V{}^+ \wedge [\alpha_{plant}]\Phi) \rightarrow X_p$ are computable.

Proof. Follows immediately from Theorem 5 with recursive enumeration of monitors.

We give a constructive proof of Theorem 6. The proof is based on the observation that, except for loop and differential invariants/variants, rule application in the $d\mathcal{L}$ calculus is deterministic: we know that, relative to an oracle for first-order invariants and variants, the $d\mathcal{L}$ calculus gives a semi-decision-procedure for $d\mathcal{L}$ formulas with differential equations having first-order definable flows.

Proof. For the sake of a contradiction, suppose that monitor synthesis stopped with some open sequent not being a first-order quantifier-free formula. Then, the open sequent either contains a hybrid program with nondeterministic repetition or a differential equation at top level, or it is not quantifier-free. But this contradicts our assumption that both $\alpha_{ctrl}$ and $\alpha_{plant}$ are free from loops and that the differential equations are solvable and disturbance is constant, in which case for Model monitor synthesis $X_m$: the solution rule $\langle ' \rangle$ would make progress, because the differential equations in $\alpha_{plant}$ are solvable; and for Prediction monitor synthesis $X_p$: the disturbance functions $f(\theta,\delta)$ and $g(\theta,\delta)$ applied to the solution provide differential invariants (see proof of Theorem 5) so that the differential cut rule, the differential invariant rule, and the differential weakening rule would make progress.

In the case of the open sequent not being quantifier-free, the quantifier elimination rule QE would be applicable and turn the formula including quantifiers into an equivalent quantifier-free formula. Hence, the open sequent neither contains nondeterministic repetition, nor a differential equation, nor a quantifier. Thus we conclude that the open sequent is a first-order quantifier-free formula.

B. Water Tank Monitor Specification Conjecture Analysis

Proof 1 shows a complete sequence of proof rules applied to the water tank specification conjecture of Example 2 on page 7, with $\Phi \equiv \varepsilon > 0$ and $\Upsilon^+ \equiv x = x^+ \wedge f = f^+ \wedge t = t^+$.

$$(\wedge r)\frac{\Gamma \vdash \phi, \Gamma \vdash \psi, \Delta}{\Gamma \vdash \phi \wedge \psi, \Delta}(Wr)\frac{\Gamma \vdash \Delta}{\Gamma \vdash \phi, \Delta}(QE)\frac{QE(\phi)_1}{\phi}$$

$$(\langle;\rangle)\frac{\langle\alpha\rangle\langle\beta\rangle\phi}{\langle\alpha;\beta\rangle\phi}(\langle?\rangle)\frac{H \wedge \psi}{\langle?H\rangle\psi}((:=))\frac{\phi_x^\theta}{\langle x:=\theta\rangle\phi}(\langle*\rangle)\frac{\exists X\langle x:=X\rangle\phi_2}{\langle x:=*\rangle\phi}$$

$$(\langle'\rangle)\frac{\exists t \geq 0((\forall 0 \leq \tilde{t} \leq t\langle x:=y(\tilde{t})\rangle H) \wedge \langle x:=y*(t)\rangle\phi)_3}{\langle x'=\theta \,\&\, H\rangle\phi}$$

$$(\exists r)\frac{\Gamma \vdash \phi(\theta), \exists x\phi(x), \Delta_4}{\Gamma \vdash \exists x\phi(x), \Delta}$$

$$(i\exists)\frac{\Gamma \vdash \exists X(\wedge_i(\Phi_i \vdash \psi_i)), \Delta_5}{\Gamma, \Phi_1 \vdash \psi_1, \Delta \cdots \Gamma, \Phi_n \vdash \psi_n, \Delta}(\exists \sigma)\frac{\phi_x^\theta}{\exists x(x=\theta \wedge \phi(x))}$$

[1] iff $\Phi \equiv QE(\Phi)$, $\Phi$ is a first order real arithmetic formula, $QE)(\Phi)$ is a quantifier free formula

[2] X is a new logical variable p [3] t and $\tilde{t}$ are fresh logical variables and $\langle x:=y(t)\rangle$ is the discrete assignment belonging to the solution y of the differential equation with constant symbol x as symbolic initial value

[4] $\theta$ is an arbitrary term, often a new (existential) logistical variable X.

[5] Among all open branches, free logical variable X only occurs in the branches $\Gamma$, $\Phi$, $\vdash\psi$, $\Delta$ $$\exists o \frac{\phi \vdash \cdots -1 \leq f^+ \leq \frac{m-x}{\varepsilon} \wedge x^+ = x + f^+t^+ \wedge t^+ \geq 0 \wedge x \geq 0 \wedge \varepsilon \geq t^+ \geq 0 \wedge f^+t^+ + x \geq 0}{\phi \vdash \cdots \exists F(-1 \leq F \leq \frac{m-x}{\varepsilon} \wedge F = f^+ \wedge x^+ = x + Ft^+ \wedge t^+ \geq 0 \wedge x \geq 0 \wedge \varepsilon \geq t^+ \geq 0 \wedge Ft^+ + x \geq 0)}$$

$$\exists r, Wr \frac{QE \frac{\phi \vdash \cdots F = f^+ \wedge x^+ = x + Ft^+ \wedge t^+ \geq 0 \wedge x \geq 0 \wedge \varepsilon \geq t^+ \geq 0 \wedge Ft^+ + x \geq 0}{\phi \vdash \cdots \forall 0 \leq \tilde{t} \leq t^+ (x + F\tilde{t} \geq 0 \wedge \tilde{t} \leq \varepsilon) \wedge F = f^+ \wedge x^+ = x + Ft^+ \wedge t^+ = t^+}}{\phi \vdash \cdots \exists T \geq 0((\forall 0 \leq \tilde{t} \leq T(x + F\tilde{t} \geq 0 \wedge \tilde{t} \leq \varepsilon)) \wedge (F = f^+ \wedge x^+ = x + FT \wedge t^+ = T))}$$

$$\langle'\rangle \frac{\phi \vdash \cdots \langle f:=F; t:=0\rangle(x'=f, t'=1 \,\&\, x \geq 0 \wedge t \leq \varepsilon)\Upsilon^+}{\langle i\rangle,(:=) \frac{\phi \vdash \cdots \langle f:=F\rangle\langle t:=0; (x'=f, t'=1 \,\&\, x \geq 0 \wedge t \leq \varepsilon)\rangle\Upsilon^+}{\phi \vdash \cdots \langle f:=F\rangle\langle\text{plant}\rangle\Upsilon^+}}$$

$$i\exists \quad \phi \vdash \cdots -1 \leq F \leq \frac{m-x}{\varepsilon}$$

$$\wedge r \frac{}{\phi \vdash \cdots \langle f:=F\rangle -1 \leq f \leq \frac{m-x}{\varepsilon} \wedge \langle\text{plant}\rangle\Upsilon^+}$$

$$(?) \frac{}{\phi \vdash \cdots \langle f:=F\rangle\langle? -1 \leq f \leq \frac{m-x}{\varepsilon} \wedge \langle\text{plant}\rangle\Upsilon^+}$$

$$\exists r, Wr \frac{}{\phi \vdash \cdots \exists F \langle f:=F\rangle\langle? -1 \leq f \leq \frac{m-x}{\varepsilon} \wedge \langle\text{plant}\rangle\Upsilon^+}$$

$$(*) \frac{}{\phi \vdash \cdots \langle f:=*; ? -1 \leq f \leq \frac{m-x}{\varepsilon}\rangle\langle\text{plant}\rangle\Upsilon^+}$$

$$(i) \frac{}{\phi \vdash \cdots \langle f:=*; ? -1 \leq f \leq \frac{m-x}{\varepsilon}; \text{plant}\rangle\Upsilon^+}$$

Proof 1. Analysis of the water tank monitor specification conjecture (plant is an abbreviation for x'=f, t'=1 & x≥0 ∧ t≤ε)

Proof 1: Analysis of the water tank monitor specification conjecture (plant is an abbreviation for x'=f, t'=1 & x ≥0 ∧ t≤ ε)

B. 1 Monitoring in the Presence of Expected Uncertainty and Disturbance

Example 7

We start at the point where we have to handle the differential inequalities. First, we eliminate the differential inequalities by rephrasing them as differential-algebraic constraints in step (DE). Then, we refine by instantiating the existential quantifiers with the worst-case evolution in step (DR). The resulting differential equation has polynomial solutions and, thus, we can use ⟨'⟩ and proceed with the proof as before.

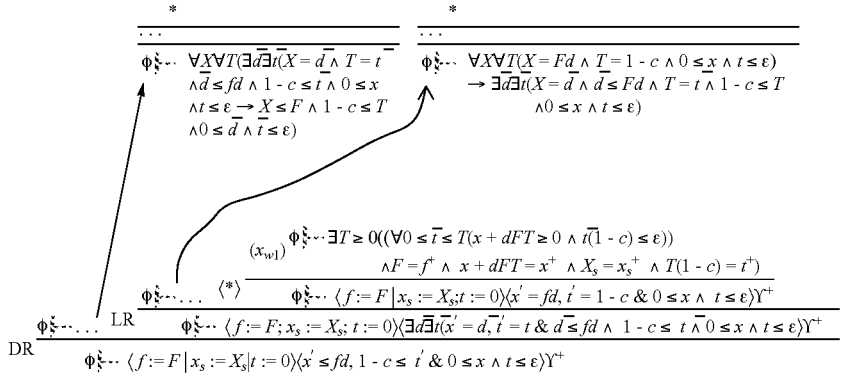

As expected, we get a more permissive monitor specification. One conjunct of the monitor specification is shown in $(X_{m1})$ Such a monitor specification says that there exists a real flow F, a real time T, and a real level $X_s$, such that the measured flow $f^+$, the clock $t^+$, and the measured level $x^+$ can be explained with the model.

C. Monitor Synthesis and Fallback Controller Design

C.1 Design-By-Contract Monitoring

Preconditions, postconditions and invariants are crucial conditions in CPS design. Monitors for these conditions can check (i) whether or not it is safe to start a particular controller (i. e., check that the precondition of a controller is satisfied), (ii) whether or not a controller complies with its specification (i. e., check that a controller delivers set values that satisfy its post condition), and (iii) whether or not the system is still within its safety bounds (i. e., check that the loop invariant of α* is satisfied).

Precondition and post condition monitors are useful to decide whether or not it is safe to invoke a controller in the current state, and whether or not to trust a controller output. An invariant monitor of a CPS α* captures the main assumptions that have to be true throughout system execution. When an invariant monitor is unsatisfied, it may no longer be safe to run the CPS; a fail-safe controller can act as a mitigation strategy.

Design-by-contract monitors are useful to monitor specific design decisions, which are explicitly marked in the model. Our approach systematically creates monitors for a complete specification of the behavior of the model.

C.2 Monitor Synthesis

Once we found a model monitor, controller monitor, or prediction monitor specification, we want to turn it into an actual monitor implementation (e. g., in C). The main challenge is to reliably transfer the monitor specification, which is evaluated on $\mathbb{R}$, into executable code that uses floating point representations. We use the interval arithmetic library Apron to represent each real arithmetic value with an interval of a pair of floating point numbers. The interval reliably contains the real.

For certification purposes one still has to argue for the correctness of the actual machine code of the synthesized monitor. This entails that the transformation from the monitor specification as a first-order formula into actual code that evaluates the formula must be formally verified. If the synthesized code is still a high-level language, a certified compiler, can be used to produce machine code. Such a comprehensive proof chain suitable for certification is part of our ongoing research.

C.3 Designing for a Fail-Safe Fallback Controller

When we design a system for a fail-safe fallback controller $ctrl_{safe}$, it is important to know within which bounds the fail-safe controller can still keep our CPS safe, and which design limits we want a controller implementation to obey. The invariant of a CPS with the fail-safe fallback controller describes the safety bounds. When we start the fail-safe fallback controller $ctrl_{safe}$ in a state where its invariant G is satisfied, it will guarantee to keep the CPS in a state that satisfies the safety property ψ.

So, to safely operate an experimental controller $ctrl_{exp}$, we want a monitor that informs us when the experimental controller can no longer guarantee the invariant of the fail-safe controller or when it is about to violate the design limits.

A design for a CPS with a fail-safe fallback controller, therefore, involves proving two properties. First, we prove that the fail-safe controller $ctrl_{safe}$ ensures the safety property ψ as in formula (4) below. This property is only provable if we discover an invariant G for the CPS with the fail-safe controller. Then we use G as the safety condition for generating a prediction monitor.

$$\emptyset \rightarrow [(ctrl_{safe};plant)^*@inv(G)]\psi$$

With this generic structure in mind, we can design for a fallback controller invoked by a model monitor $X_m$, controller monitor $X_c$, or prediction monitor $X_p$. Upon violation of either $X_m$, $X_c$, or $X_p$ by the actual system execution, the set values of a fail-safe controller are used instead.

D. Monitor Synthesis Algorithm

Figure 4:
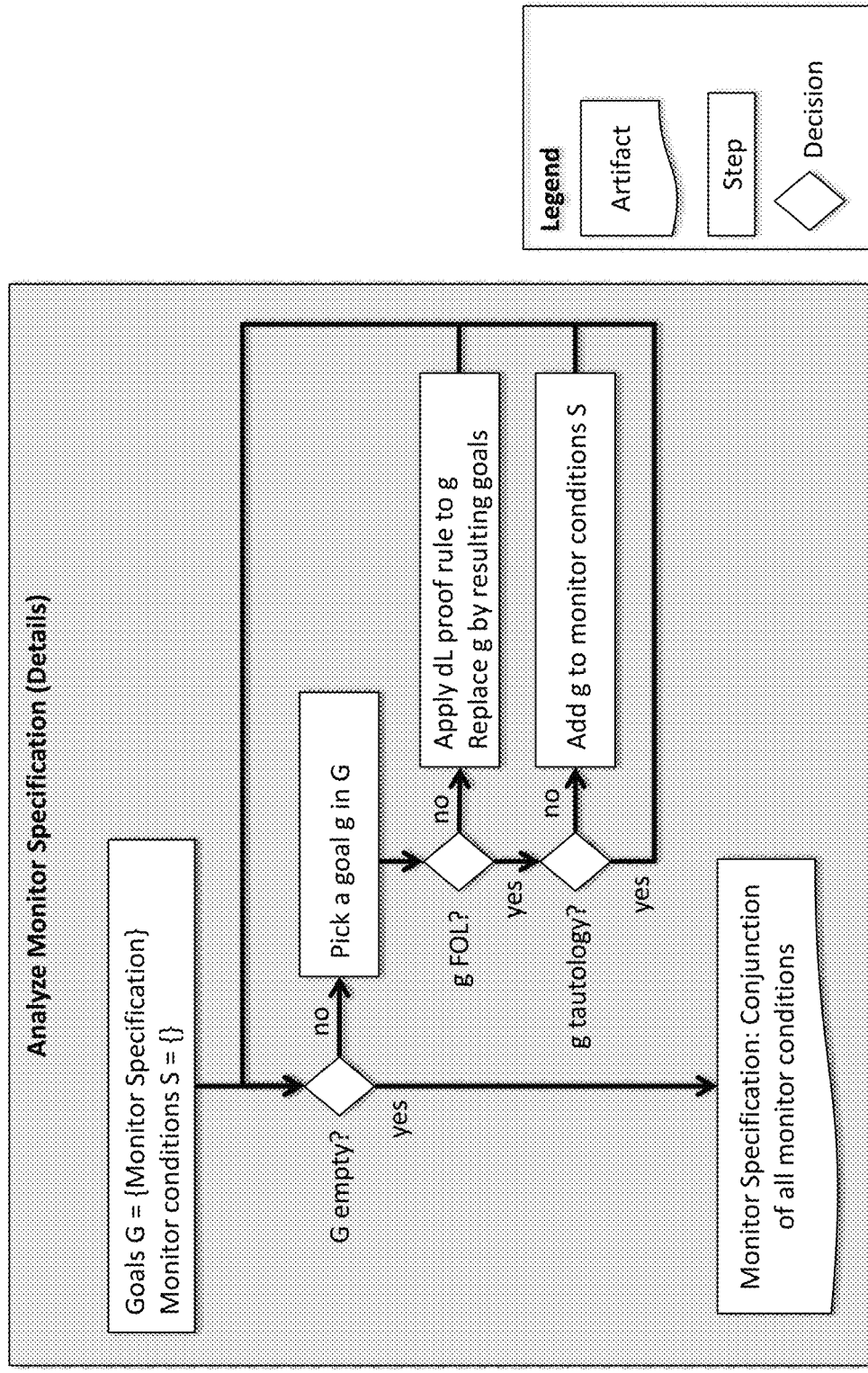
FIG. 4 is a flow chart of the "Analyze Monitor Specification" step of the process shown in FIG. 3

Algorithm 1 lists the ModelPlex specification conjecture analysis algorithm 106, which turns a specification conjecture into an actual monitor, and is shown in flow-chart form in FIG. 4. The algorithm takes a hybrid system model α, a set of variables V that we want to monitor, and an initial condition ø including constraints on the variables not changed in α. (Usually, we want a monitor for all the bound variables of the hybrid system model, i.e., V=BV (α).

```
              Algorithm 1: ModelPlex monitor synthesis
   input:    A hybrid program α, a set of variables V ⊆ BV (α), an initial condition φ
             such
             that |= φ → [α*] ψ,
   output:   A monitor X_m such that |= X_m ≡ φ|_const → ⟨α⟩r+.
   begin     S ← ∅
             γ+ ← Λ_{x∈V} x = x+ with fresh variables x_i+     // Monitor conjecture
             G ← {⊢ φ|_const → ⟨c⟩γ+}
1            while G ≠ ∅ do                                    // Analyze monitor conjecture
               foreach g ∈ G do
                 G ← G - {g}
                 if g is first-order then
                   if |≠ g then S ← S ∪ {g}
                 else
                   g̃ ← apply dL proof rule to g
                   G ← G ∪ {g̃}
             X_m ← Λ_{s∈S} s                                   // Collect open sequents
```

E. Simulation

To illustrate the behavior of the water tank model with a fallback controller, we created two monitors: Monitor $X_m$ validates the complete model (as in the examples throughout this work) and is executed at the beginning of each control cycle (before the controller runs). Monitor $X_c$ validates only the controller of the model α (compares prior and post state of f:=*; ?

$$-1 \le f \le \frac{m-x}{\varepsilon})$$

the controller but before control actions are issued. Thus, monitor $X_c$ resembles conventional runtime verification approaches, which do not check CPS behavior for compliance with the complete hybrid model. This way, we detect unexpected deviations from the model at the beginning of each control cycle, while we detect unsafe control actions immediately before they are taken. With only monitor $X_m$ in place we would require an additional control cycle to detect unsafe control action, whereas with only monitor $X_c$ in place we would miss deviations from the model. Note that we could run monitor $X_m$ in place of $X_c$ to achieve the same effect. But monitor $X_m$ implements a more complicated formula, which is unnecessary when only the controller output should be validated.

Figure 2:
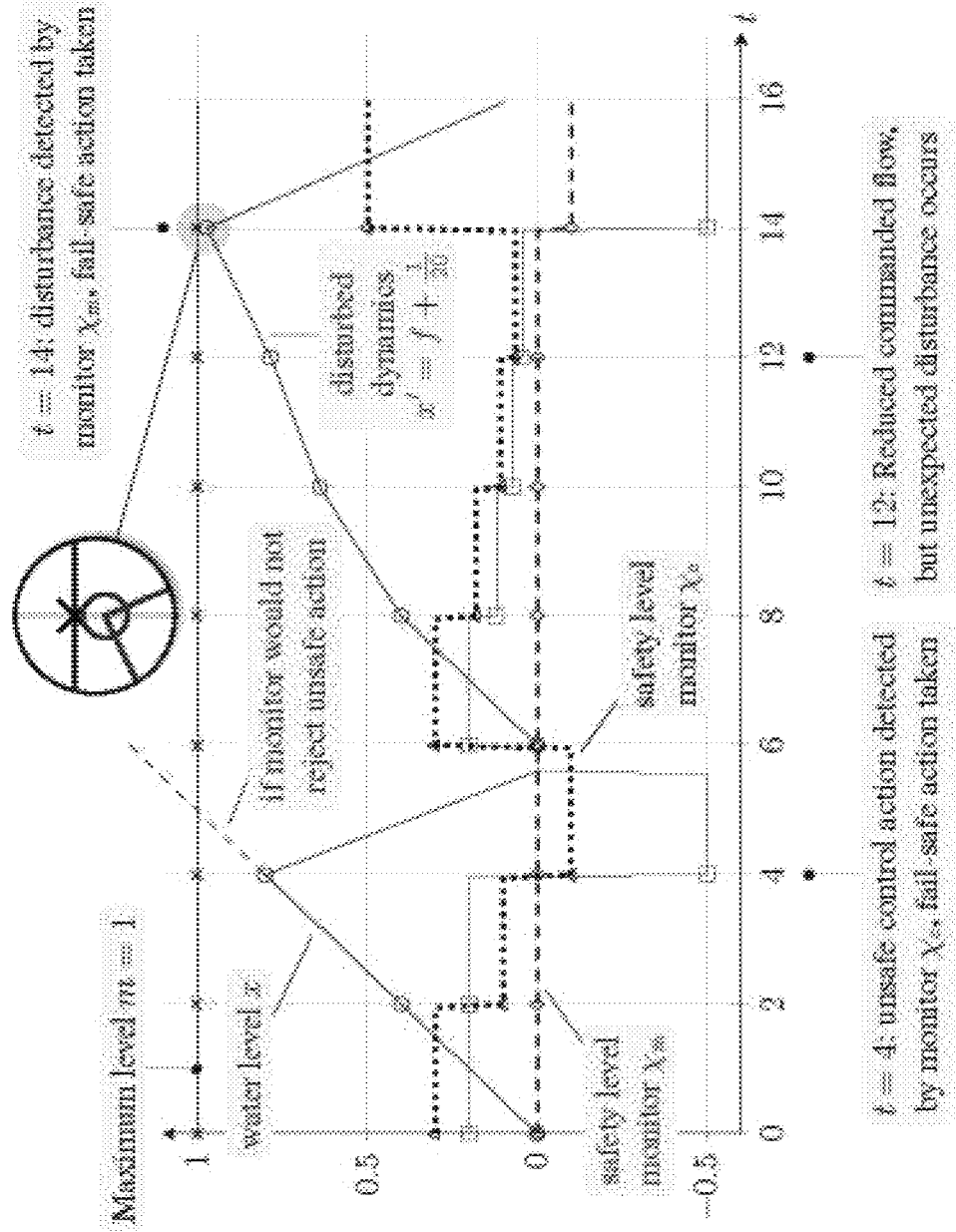
FIG. 2 show the water tank simulation using monitors

FIG. 2 shows a plot of the variable traces of one simulation run. In the simulation, we ran the pump controller every 2 s ($\varepsilon$=2 s, indicated by the grid for the abscissa and the marks on sensor and actuator plots). The controller was set to pump with $$\frac{5(m-x_0)}{\varepsilon} = \frac{5}{2}$$

for the first three controller cycles, which is unsafe on the third controller cycle. Monitor B immediately detects this violation at t=4, because on the third controller cycle setting $$f = \frac{5}{2}$$

violates $$f \le \frac{m-x_1}{\varepsilon}.$$

The fail-safe action at t=4 drains the tank and, after that, normal operation continues until t=12. Unexpected disturbance $$x' = f + \frac{1}{20}$$

occurs throughout t=[12,14], which is detected by monitor $X_m$. Note, that such a deviation would remain undetected with conventional approaches (monitor $X_c$ is completely unaware of the deviation). In this simulation run, the disturbance is small enough to let the fail-safe action at t=14 keep the water tank in a safe state.

We claim:

1. A computer-implemented method for synthesizing a monitor for a cyber-physical system (CPS) from a verified model of the CPS, the verified model expressed as a set of mathematical formulas, comprising the steps of:
    deriving a monitor specification from the verified model, the monitor specification comprising a set of specification conjectures, each specification conjecture derived from one of the set of mathematical formulas by verified transformation such that each specification conjecture is satisfied over states of the CPS only if the states are compatible with behavior of the verified model;

applying a theorem prover to each specification conjecture to derive one or more monitor conditions expressed as first-order logic by performing logical transformations that successively simplify formulas into structurally simpler formulas expressing effects of the verified model behavior;

synthesizing the monitor by syntactic transformation or compilation of the monitor conditions to executable code that verifies the monitor conditions; and verifying the behavior of the CPS by executing the monitor to determine that the CPS meets the set of monitor conditions indicating compliance with the verified model;

wherein the CPS includes a controller running control software, the controller reading sensors and controlling actuators, and wherein the monitor verifies the actions of the controller and resulting changes in a state of the CPS.

2. The method of claim 1 further comprising the step of executing the monitor in conjunction with the control software, to guarantee compliance of the CPS with the verified model.

3. The method of claim 1 where the monitor consists of a model monitor, a controller monitor and a prediction monitor.

4. The method of claim 3 wherein the model monitor compares a current state of the CPS with a previous state of he CPS and determines if any differences between the current state and the previous state are in compliance with the verified model.

5. The method of claim 3 wherein the controller monitor monitors the controller to check compliance with the verified model.

6. The method of claim 3 wherein the prediction monitor allows deviations of the cyber-physical system from the verified model to account for real-world imperfections.

7. The method of claim 4 wherein the model monitor, the controller monitor and the prediction monitor read the sensors to determine the current state of the CPS.

8. The method of claim 7 wherein the model monitor runs prior to the control software and determines if physical behavior which occurred between the previous state and the current state is in compliance with the verified model.

9. The method of claim 8 wherein the model monitor will raise an error if any differences between the current state and the previous state are not in compliance with the verified model.

10. The method of claim 5 wherein the controller monitor runs after the control software and determines if physical actions to be taken by the controller will result in the CPS being in compliance with the verified model.

11. The method of claim 10 wherein the controller monitor will raise an error if the physical actions will result in the CPS not being in compliance with the verified model.

12. The method of claim 6 wherein the prediction monitor runs after the control software and determines if physical actions to be taken by the controller will result in the CPS being in compliance with the verified model in the presence of bounded deviations between the CPS and the verified model.

13. The method of claim 12 wherein the prediction monitor will raise an error if the physical actions to be taken by the controller will result in the CPS not being in compliance with the verified model.

14. The method of claim 1 wherein the verified model comprises a set of formulas of the form:

$$\Phi \to [\alpha^*]\psi \text{ with invariant } \psi \to [\alpha]\psi \text{ s.t. } \Phi \to \varphi \text{ and } \varphi \to \psi \quad (1)$$

where:

$\Phi$ is a precondition for the run;

$\alpha^*$ describes repeated runs of the hybrid system;

$\alpha$ is the hybrid system model;

$\psi$ is a postcondition for the run; and $\varphi$ is a loop invariant.

15. The method of claim 8 wherein compliance with the model monitor guarantees that properties of the verified model are present in the CPS before the control software is executed.

16. The method of claim 10 wherein compliance with the controller monitor guarantees that properties of the verified model are present in the CPS after the control software is executed.

17. The method of claim 12 wherein compliance with the prediction monitor guarantees that properties of the verified model will still be present in future states of the CPS.

18. The method of claim 1 wherein the method is automated in accordance with an algorithm.

19. The method of claim 1 wherein the mathematical formulas are differential dynamic logic formulas.

20. The method of claim 3, wherein the prediction monitor predicts a next state of the CPS based on the actions to be taken by the controller and initiates failsafe actions if the next state of the CPS deviates from the verified model.

* * * * *

UNITED STATES PATENT AND TRADEMARK OFFICE
CERTIFICATE OF CORRECTION

PATENT NO. : 10,872,187 B2  Page 1 of 1
APPLICATION NO. : 15/026690
DATED : December 22, 2020
INVENTOR(S) : André Platzer and Stefan Mitsch It is certified that error appears in the above-identified patent and that said Letters Patent is hereby corrected as shown below:

In the Claims

Column 25, Claim 4, Lines 27-28; Please replace "previous state of he CPS and determines" with
-- previous state of the CPS and determines --

Signed and Sealed this
Ninth Day of February, 2021

Drew Hirshfeld
*Performing the Functions and Duties of the*
*Under Secretary of Commerce for Intellectual Property and*
*Director of the United States Patent and Trademark Office*